United States Patent [19]

Usui

[11] Patent Number: 4,851,764
[45] Date of Patent: Jul. 25, 1989

[54] HIGH TEMPERATURE ENVIRONMENTAL TESTING APPARATUS FOR A SEMICONDUCTOR DEVICE HAVING AN IMPROVED HOLDING DEVICE AND OPERATION METHOD OF THE SAME

[75] Inventor: Toshio Usui, Yokohama, Japan

[73] Assignee: Fujitsu Limited, Kanagawa, Japan

[21] Appl. No.: 48,694

[22] Filed: May 12, 1987

[30] Foreign Application Priority Data

May 16, 1986 [JP] Japan .................. 61-110833

[51] Int. Cl.$^4$ .................. G01R 31/26; H01P 5/08
[52] U.S. Cl. .................. 324/158 F; 333/247
[58] Field of Search ............. 324/158 F; 333/246, 333/247

[56] References Cited

U.S. PATENT DOCUMENTS

| | | | |
|---|---|---|---|
| 3,775,644 | 9/1972 | Cotner et al. | 324/158 F |
| 4,365,195 | 12/1982 | Stegens | 324/158 F |
| 4,535,307 | 8/1985 | Tsukii | 333/35 |
| 4,538,124 | 8/1985 | Morrison | 333/246 |
| 4,574,235 | 3/1986 | Kelly et al. | 324/158 F |
| 4,707,656 | 11/1987 | Marzan | 324/158 F |

FOREIGN PATENT DOCUMENTS

| | | | |
|---|---|---|---|
| 0106196 | 4/1984 | European Pat. Off. | |
| 93058 | 7/1981 | Japan | 324/158 T |
| 57-44866 | 3/1982 | Japan. | |
| 161871 | 9/1983 | Japan | 324/158 F |
| 163573 | 9/1984 | Japan | 324/158 F |

OTHER PUBLICATIONS

Wilhemsen et al., "Temperature vs. Reliability in Power GaAS FETs and MIC GaAS FET Power Amplifiers", May 1984.

Omori et al., "Accelerated Active Life Test of GaAS FET and a New Failure Mode", *Conf.: 18th Ann. Proc. of Reliability Physics,* Apr. 1980, pp. 134–140.

*Primary Examiner*—Jerry Smith
*Assistant Examiner*—Stephen M. Baker
*Attorney, Agent, or Firm*—Armstrong, Nikaido, Marmelstein, Kubovcik & Murray

[57] ABSTRACT

An improved holding device for holding a semiconductor device, particularly a microwave semiconductor device, in a high temperature environmental testing apparatus. The holding device includes a heat block having a heat source therein, and a cooling block for cooling the microstrip matching circuits and coaxial connectors. Both blocks are spatially isolated from each other by an air space. The semiconductor device is set on the top surface of the heat block. As a result, the semiconductor device is effectively heated up to the predetermined testing temperature, while the microstrip matching circuits and the connectors are protected from the temperature rise caused by the heat flow from the heat block. Appropriate grounding arrangements for the semiconductor device are provided by a metal foil for projections on the side walls of the cooling block.

16 Claims, 4 Drawing Sheets

HIGH TEMPERATURE ENVIRONMENTAL TESTING APPARATUS FOR A SEMICONDUCTOR DEVICE HAVING AN IMPROVED HOLDING DEVICE AND OPERATION METHOD OF THE SAME

FIELD OF THE INVENTION

The present invention relates to a high temperature environmental testing apparatus of a semiconductor device and the operation method thereof. Particularly, it relates to an improvement of a means for holding the microwave semiconductor device in a testing apparatus in order to be tested.

BACKGROUND OF THE INVENTION

A semiconductor device used in a critical system, such as a space communication system, is required to reliably perform under severe environmental conditions for an extended period of time, for example, for a period of at least ten years or longer. Various environmental tests are performed in order to evaluate the quality of the semiconductor device under these conditions.

A high temperature environmental test of a microwave semiconductor device is performed at a temperature ranging from 200° C. to 250° C. for a predetermined period. The test is indispensable for developing new highly reliable semiconductor devices since the test is used to estimate the life of the new semiconductor device under a critical condition.

One problem that occurs with a high temperature environmental test is when a microwave semiconductor device, such as a gallium arsenide field effect transistor (GaAs-FET) which is operable at a frequency up to 18 GHz is tested. Generally, a holding device is used for holding the microwave semiconductor device which is placed into the testing apparatus. The holding device includes plates which have microstrip matching circuits. The holding device also has connectors which are connected to outer circuits arranged in the extreme proximity of the semiconductor device to be tested. The connectors are provided in order to reduce the microwave power reflection due to the sharp transition of the transmitting impedance of the transmission lines.

In the prior art high temperature environmental testing apparatus, the microstrip circuit plates and the connectors are exposed to a high temperature environment together with the semiconductor device under test. Thus, during the testing period, the microstrip matching circuits and the connectors are subject to some degree of damage such as oxidation of the contacts of the connectors and chemical and mechanical damage of the microstrip matching circuit plates. The chemical and mechanical damage includes damage done to microstrip patterns which are formed on substrates. The microstrip patterns are damaged due to cyclical thermal stress caused by intermittent breaks for measuring the change of the electric characteristics of the semiconductor device during the test period.

FIG. 1 is a perspective view of a prior art holding device used for a high temperature environmental test of a semiconductor device, such as a GaAs-FET 62, for example. Microstrip matching circuit plates 60 are provided on a base block 64 made of copper or aluminum. The microstrip matching circuit plates are connected to the semiconductor device to be tested. Each circuit plate 60 comprises a substrate 63 made of alumina, teflon, etc., a microstrip pattern 67 including a transmission line 68, formed on the top surface of the substrate 63, and a co-axial connector 66 connected to the transmission line 68. The holding device further includes a heat block 65 made of copper or aluminum, having a heating source therein.

The semiconductor device, the GaAs-FET 62, usually has a metallic base 69 and leads 61 for input and output of transmission power. The semiconductor device is electrically grounded through the metallic base 69. The FET 62 is placed into the high temperature testing apparatus on the holding device. This is done by tightly attaching the metallic base 69 to the base block 64 using screws 70. The leads 61 are soldered or pressed to the transmission lines 68. Then, the base block 64 is placed on the heat block 65 in contact face-to-face. With such a structural configuration, the heat generated in the heat block 65 is transferred to the base block 64, and then to the FET 62 through the metallic base 69 to raise the temperature of the FET 62 up to a predetermined testing value, such as 250° C. However, at the same time, the heat is easily transferred to the microstrip matching circuit plates 60 and the co-axial connectors 66, raising the temperatures of these elements to a high level approximately near the testing temperature. As a result, the above-described damage occurs.

No problems arise when the ground potential is applied to the semiconductor device 62 and to the microstrip matching circuit plates 68 because the ground potential is applied to the base block 64.

The above-described defects of the prior art holding device need to be eliminated in order to achieve a more reliable high temperature environmental test result.

SUMMARY OF THE INVENTION

The object of the present invention is to provide an improved holding device for holding a semiconductor device which is to be tested in a high temperature environmental testing apparatus, and an operation method thereof.

It is a further object of the present invention to provide a holding device described above, having a structure which allows the heat generated by a heating source to flow mainly to the semiconductor device under test, and to limit the heat flow to the matching circuit plates located in the vicinity of the semiconductor device in order to avoid damage to the matching circuits.

The holding device according to the present invention has a heat block and a cooling block which are thermally isolated from each other by an air space. A semiconductor device is directly attached to the heat block such that the heat generated in the heat block can be transferred directly to the semiconductor device with only a negligible heat transfer resistance therebetween. On the other hand, the microstrip matching circuit plates and the connectors are attached to a cooling block to prevent the temperature rise thereof. Since the major part of the cooling block is spatially isolated by the air space existing therebetween, the heat flow from the heat block is almost eliminated. As a result, the microstrip matching circuits and the connectors disposed in the holding device are protected from experiencing a rise in temperature.

The holding device of the present invention is provided with a grounding means for grounding the semiconductor device and the matching circuits. The grounding means is a thin metallic foil which is disposed between the heat block and the semiconductor device, and is connected to the cooling block. A second type of grounding means is a small metallic projection which projects from the cooling block. The metallic projection is arranged to be in contact with the metallic base of the semiconductor device. The ground potential is thereby applied to the semiconductor device through the cooling block.

Other features and advantages of the present invention will be apparent from the following description of the embodiments, claims and the drawings in which like reference numerals designate like parts.

DESCRIPTION OF THE PREFERRED EMBODIMENTS

Figure 1:
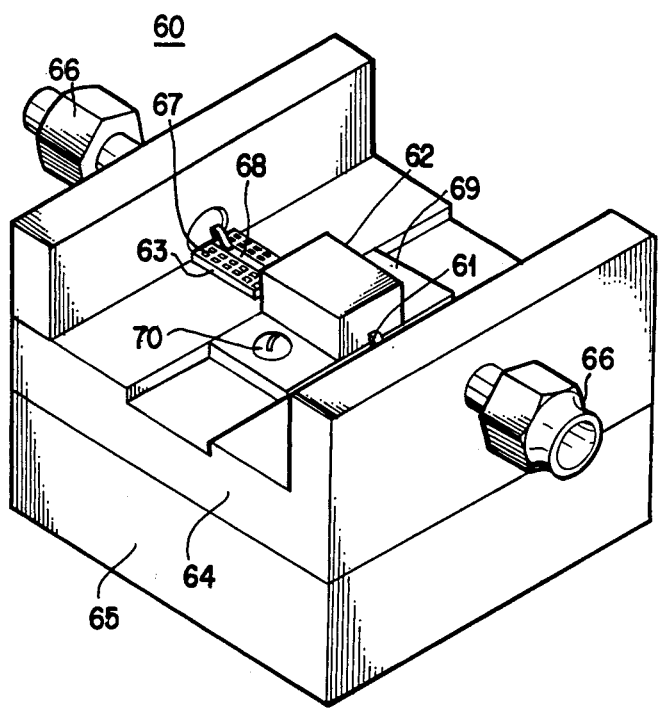
FIG. 1 is a perspective view of a prior art holding device for a high temperature environmental testing apparatus used to test a microwave semiconductor device.
Figure 2:
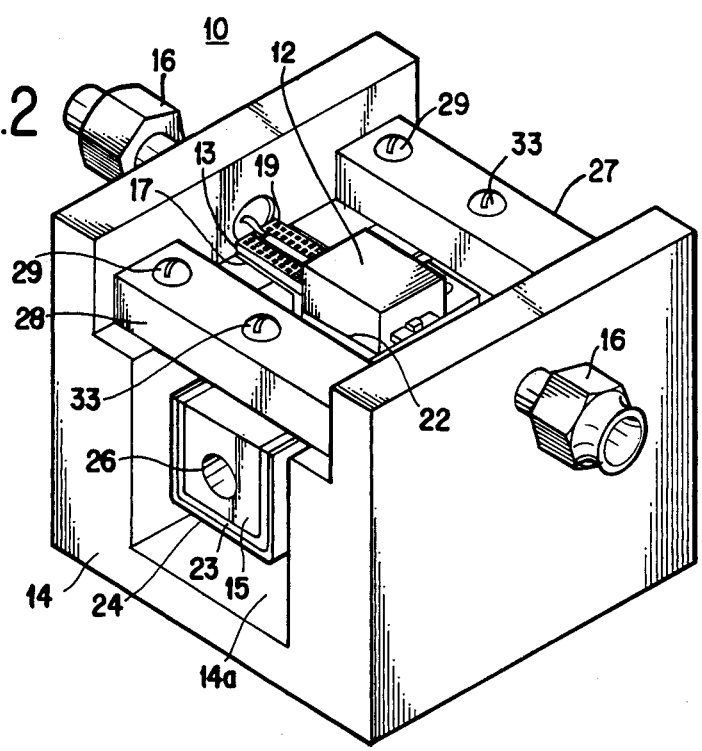
FIG. 2 is a perspective view of a holding device of a first embodiment of the present invention.
Figure 3:
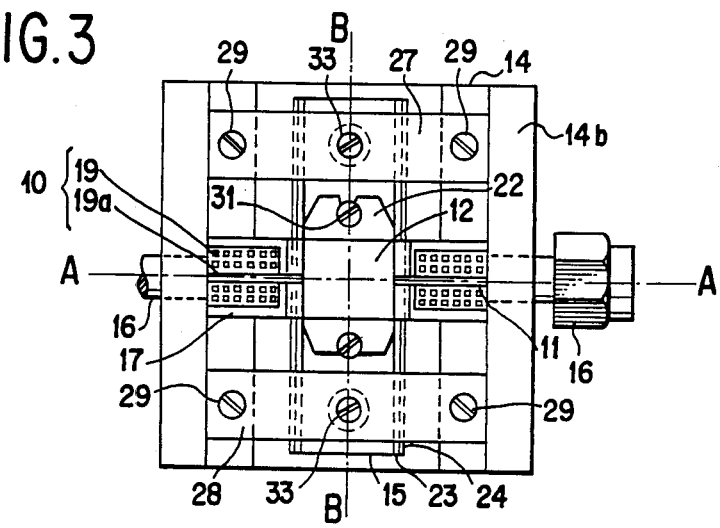
FIG. 3 is a plan view of the holding device of FIG. 2.
Figure 4:
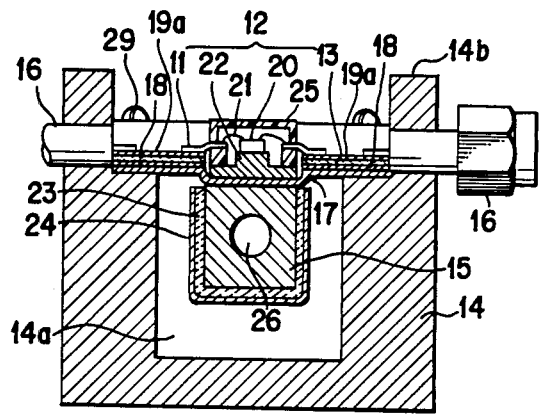
FIG. 4 and FIG. 5, are respectively cross-sectional views of the holding device of FIG. 3, taken along line A—A and line B—B.
Figure 5:
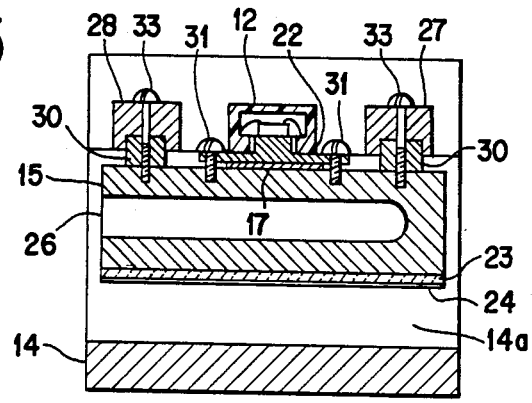

FIG. 2 and FIG. 3 are respectively a perspective view and a plan view of a first embodiment of the present invention, illustrating the structure thereof and a state where a semiconductor device 12 is placed on the holding device. FIG. 4 and FIG. 5 are respectively cross-sectional views taken along lines A—A and B—B.

A heat block 15 is made of copper, aluminum or brass. The outer surface, except for the top surface of the heat block 15, is covered by a layer of asbestos 23. A stainless steel plate 24 is disposed over the asbestos 23 for heat insulation. The heat block 15 is heated by a cartridge type heater 26 (schematically shown) installed thereinside. The heating power of the heater 26 is controlled by an external temperature controller (not shown). A cooling block 14, made of aluminum, has a large moat 14a which runs in the direction B—B (shown in FIG. 3). The heat block 15 is suspended in the moat 14a by bridge plates 27 and 28. Thus, the heat block 15 is spatially separated from the cooling block 14 by an air space. The heat block 15 is tightly fixed to the bridge plates 27 and 28 by screws 33. A small gap is maintained between the plates and the heat block by ceramic spacers 30. This is to reduce the heat conduction from the heat block 15 to the cooling block 14. The bridge plates 27 and 28 are attached to the cooling block 14 by screws 29.

A pair of microstrip matching circuit plates 10 are disposed on the top surface of the cooling block 14 such that a semiconductor device 12 to be tested is connected to the external testing circuits (not shown) therethrough. The matching circuit plate 10 has a conventional structure comprising a ceramic substrate 13, and a microstrip pattern 19 having a transmission line 19a formed on the top surface of the substrate 13. At the back side of the substrate 13, a ground pattern 18 is formed and is directly in contact with the surface of the cooling block 14. A co-axial connector 16 is electrically connected to the transmission line 19a by being inserted through a standing wall 14b of the cooling block 14.

As a means for providing ground potential to the semiconductor device 12, a grounding foil 17, made of a metallic foil such as a copper foil which is plated with gold plating layer 50 $\mu$m thick, is stretched across the moat 14a at the center portion of the cooling block 14. The grounding foil 17 is soldered and connected to the grounding pattern 18 of the microstrip matching circuit using gold-silicon alloy solder containing silicon of 18% by weight, AuSi18. Instead of being soldered to the grounding line 18, the grounding foil 17 may be directly soldered to a side wall of the moat 14a formed in the cooling block 14 using a solder material such as a gold tin alloy solder containing 25% tin, AuSn25, or a gold silicon alloy, AuSi18.

The semiconductor device, GaAs-FET 12, to be tested has a gallium arsenide chip 20 which is mounted on a metallic base 22, and bonded to leads 11 by bonding wires 21. The chip 20 and bonding wires 21 are protected with a plastic coverage 25. The FET 12 is placed on the ground foil 17, and is tightly attached to the heat block 15 by screwing the flange of the metallic base 22 with screws 31. In this case, the grounding foil 17 is also pressed by the metallic base 22 and is tightly attached to the heat block 15 without a heat transfer resistance. The leads 11 are tightly pressed and deformed to be attached to the transmission lines 19a or are soldered thereto. Thus, the placement of the FET 12 into the holding device is completed.

With the above structural configuration, the heat generated in the heat block 15 is transferred effectively and directly to the FET 12. The heat cannot be transferred to the cooling block 14, because the major portion of the heat block 15 is spatially and thermally isolated from the cooling block 14 by an air space. The only heat that can be transferred is the heat that will pass through the supporting means, namely, the bridge plates 27 and 28. The bridge plates 27 and 28 are connected to the heat block 15 with a separating air space formed using ceramic spacers 30; thus, forming a heat flow limiting configuration. As a result, according to experimental measurements, when the temperature of the FET 12 is maintained at 250° C., for example, the temperature of the matching circuit 10 is kept below 65° C.

The ground potential, particularly for a high frequency power supply, is secured by the ground foil 17, because the cooling block 14 is usually electrically grounded. The pass between the transmission line 19a and the metallic base 22 is substantially short in order to eliminate any harmful microwave impedance therebetween. As a result, the high temperature environmental test can be performed (a) by inputting a driving signal and outputting a load power to and from the FET 12 through the leads 11, transmission lines 19a and co-axial connectors 16, and (b) by raising the temperature of the FET 12 by heating the heat block 15, for a predetermined period, without damaging the microstrip matching circuit plates 10 and the connectors 16.

Figure 6:
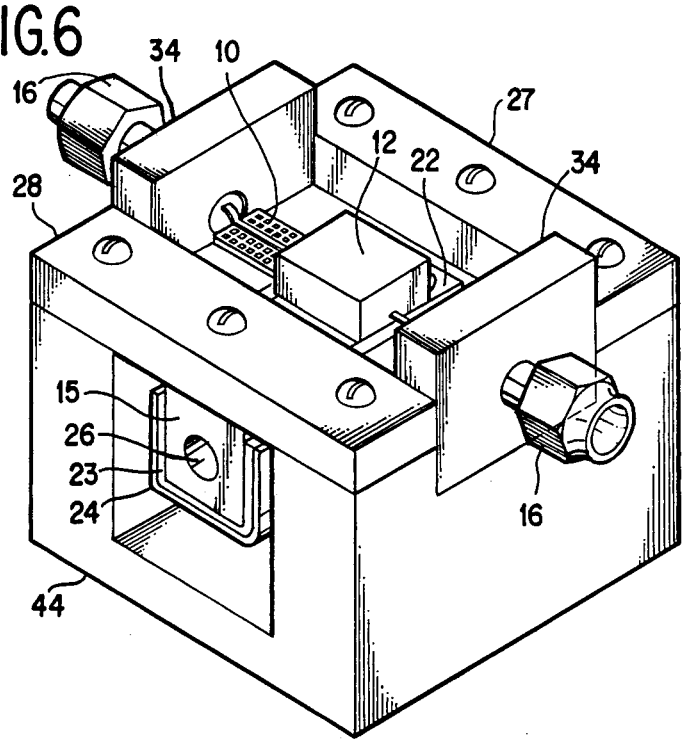
FIG. 6 is a perspective view of a second embodiment of the present invention of a holding device for a high temperature environmental testing apparatus used to test a microwave semiconductor device.

FIG. 6 is a perspective view illustrating a second embodiment having a second type of grounding means.

Figure 7:
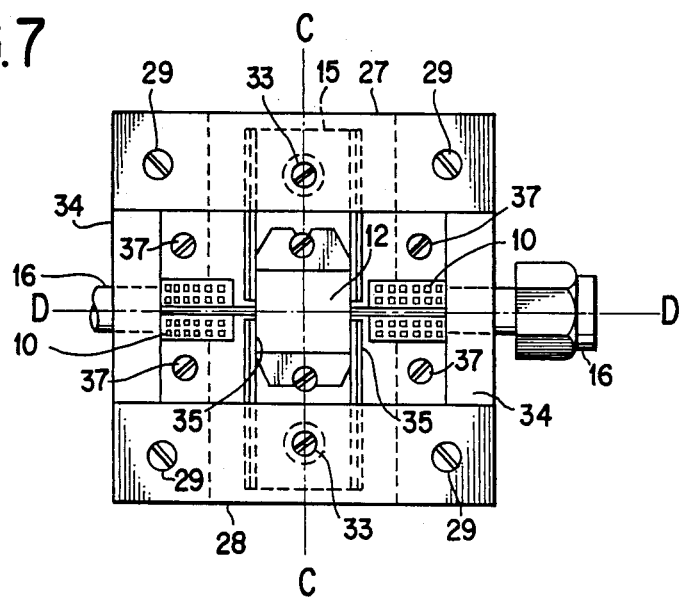
FIG. 7 is a plan view of the holding device of FIG. 6.
Figure 8:
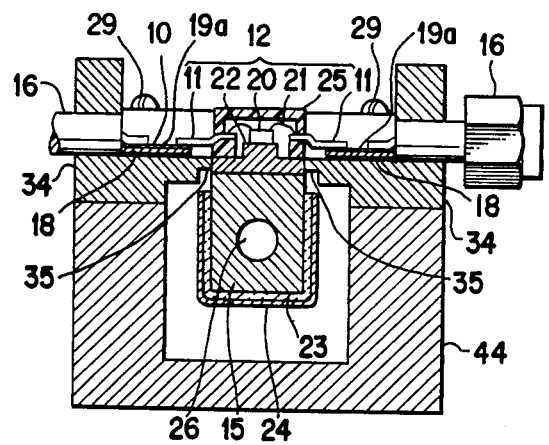
FIG. 8 and FIG. 9 are respectively cross-sectional views of the holding device of FIG. 7, taken along line C—C and line D—D.
Figure 9:
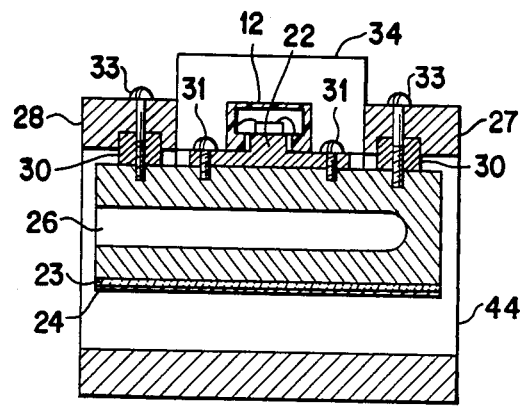

FIG. 7 is a plan view of the same, and FIG. 8 and FIG. 9 are cross-sectional views taken along lines C—C and D—D shown in FIG. 7.

Figure 10:
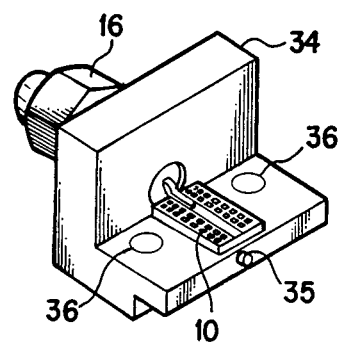
FIG. 10 is a perspective view of an L-type seat block illustrated in FIG. 6.

As is apparent from the figures, the grounding means of the holding device is improved by being convenient for holding the semiconductor. A cooling block 44, made of aluminum, has a modified form which is different from that of the cooling block 14 of the first embodiment. Instead of the grounding foil 17 of the preceding embodiment, an L-type seat block 34, made of brass, is used. The seat block 34 is illustrated in a perspective view in FIG. 10. The microstrip matching circuit plates 10 and the co-axial connectors 16 are mounted on the L-type seat block 34 in the same manner as in the first embodiment. Instead of the grounding foil 17 of the first embodiment, a projection 35 is formed on the front wall of the L-type seat block 34 (see FIG. 7, FIG. 8 and FIG. 10). The L-type seat 34 is fixed to the cooling block 44 through screw holes 36 by screwing the screws 37 such that the front of the projection 35 steadily contacts with the metallic base 22 of the FET 12. The holes 36 have an elongated inner length in the direction of D—D which allow the adjustment of the position of the L-type seat 34 in the same direction in accordance with the semiconductor device to be tested. As a result, since the cooling block 44 is usually electrically grounded, the ground potential is provided to the FET 22 through the contact between the projection 35 and the metallic base 22.

Although there have been described what are at present considered to be the preferred embodiments of the present invention, it will be understood that the invention may be embodied in other specific forms without departing from the spirit or essential characteristics thereof. The present embodiments are therefore to be considered in all aspects as illustrative, and not restrictive. The scope of the invention is indicated by the appended claims rather than by the foregoing description.

What we claim is:

1. A high temperature environmental testing apparatus having a holding means for holding a semiconductor device to be tested, said semiconductor device includes a thermally and electrically conductive base member, said holding means comprising:
   a plurality of microstrip matching circuit plates, each of said plates including an electrically insulative substrate, a microstrip matching circuit formed on a top surface of said substrate, and a grounding pattern formed on a back side of said substrate, said microstrip matching circuit plates being electrically connectable to said semiconductor device;
   an output terminal means for providing said microstrip matching circuit plates with signals and a ground potential, said output terminal means being electrically connected to said microstrip matching circuit plates;
   a grounding means for electrically grounding said semiconductor device, said grounding means being a metallic foil;
   a cooling block for cooling said microstrip matching circuit plates, said microstrip matching circuit plates being mounted on said cooling block;
   a heat block for heating said semiconductor device, said heat block being attachable to said base member of said semiconductor device in surface-to-surface contact and said heating block being heated by a heating source; and
   supporting means being connected to said cooling block and said heat block, said supporting means for suspending said heat block in an air space, said heat block being positioned spatially and thermally isolated from said cooling block by said air space except where said supporting means contacts said heating block.

2. A high temperature environmental testing apparatus of claim 1, wherein said metallic foil is made of copper, and is gold plated.

3. A high temperature environmental testing apparatus of claim 1, wherein said metallic foil is electrically connected to said grounding pattern of said microstrip matching circuit plate.

4. A high temperature environmental testing apparatus of claim 1, wherein said metallic foil is electrically connected to said cooling block.

5. A high temperature environmental testing apparatus of claim 1, wherein said metallic foil is inserted between said heat block and said base member of said semiconductor device, and said metallic foil, said heat block and said base member are in a tight contact with each other.

6. A high temperature environmental testing apparatus of claim 1, wherein said supporting means comprises a pair of supporting plates made of metal.

7. A high temperature environmental testing apparatus of claim 6, wherein said supporting plates are attached to said heat block at portions in the vicinity of ends of said heating block, and said semiconductor device is placed in the center of said heat block.

8. A high temperature environmental testing apparatus of claim 6, wherein said supporting plates are fixed to said heat block maintaining an air space between facing surfaces of said heat block and said supporting plates, said support plates being spaced from said heat 9. A high temperature environmental testing apparatus according to claim 1, wherein said cooling block has a moat therein and said heat block is suspended in said moat by said supporting means.

10. A high temperature environmental testing apparatus according to claim 1, wherein said heat block is connected to said supporting means by a connecting means.

11. A high temperature environmental testing apparatus according to claim 10, wherein said connecting means are screws.

12. A high temperature environmental testing apparatus having a holding means for holding a semiconductor device to be tested, said semiconductor device includes a thermally and electrically conductive base member, said holding means comprising:
   a plurality of microstrip matching circuit plates, each of said plates including an electrically insulative substrate, a microstrip matching circuit formed on a top surface of said substrate, and a grounding pattern formed on a back side of said substrate, said microstrip matching circuit plates being electrically connectable to said semiconductor device;
   an output terminal means for providing said microstrip matching circuit plates with signals and a ground potential, said output terminal means being electrically connected to said microstrip matching circuit plates;
   a grounding means for electrically grounding said semiconductor device, said grounding means is a projection formed on a side wall of said cooling block facing a surface of said base member of said semiconductor device, and said projection is disposed such that the confronting surface of said projection is in electrical contact with said base member;

a cooling block for cooling said microstrip matching circuit plates, said microstrip matching circuit plates being mounted on said cooling block;

a heat block for heating said semiconductor device, said heat block being attachable to said base member of said semiconductor device in surface-to-surface contact and said heating block being heated by a heating source; and supporting means being connected to said cooling block and said heat block, said supporting means for suspending said heat block in an air space, said heat block being positioned spatially and thermally isolated from said cooling block by said air space except where said supporting means contacts said heating block.

13. A high temperature environmental testing apparatus of claim 12, further comprising a metallic seat block on which said microstrip matching circuit is disposed and said projection is formed on a wall of said metallic seat facing said metallic base of said semiconductor device.

14. A high temperature environmental testing apparatus of claim 12, wherein said supporting means comprises a pair of supporting plates made of metal.

15. A high temperature environmental testing apparatus of claim 14, wherein supporting plates are attached to said heat block at portions in the vicinity of ends of said heating block, and said semiconductor device is placed in the center of said heat block.

16. A high temperature environmental testing apparatus of claim 14, wherein supporting plates are fixed to said heat block maintaining an air space between facing surfaces of said heat block and said supporting plates, said support plates being spaced from said heat block by ceramic spacers.

* * * * *